United States Patent [19]

Gelin et al.

[11] 4,091,440
[45] May 23, 1978

[54] MECHANICAL SUPPORT SYSTEM FOR PRINTED CIRCUIT BOARDS

[75] Inventors: Claude Gelin, Creteil; Jean Lavigne, Fresnes, both of France

[73] Assignee: CGEE Alsthom S.A., Levallois-Perret, France

[21] Appl. No.: 763,256

[22] Filed: Jan. 26, 1977

[30] Foreign Application Priority Data

Jan. 29, 1976    France .............................. 76 02405

[51] Int. Cl.² ............................................. H02B 1/02
[52] U.S. Cl. ..................................... 361/415; 361/399
[58] Field of Search ............... 361/413, 415, 414, 394, 361/399; 339/17 L, 17 LM, 17 LC, 176 M

[56] References Cited

U.S. PATENT DOCUMENTS

| 3,202,955 | 8/1965 | McKee | 361/415 |
|---|---|---|---|
| 3,253,190 | 5/1966 | Evans | 361/394 |

Primary Examiner—David Smith, Jr.

Attorney, Agent, or Firm—Sughrue, Rothwell, Mion, Zinn and Macpeak

[57] ABSTRACT

A mechanical support system for printed circuit boards comprising $n$ identical elementary sub-assemblies assembled together, $n$ being any positive integer, each sub-assembly comprising a moulded plastics mounting plate having fixed on one of its surfaces means by sliding cooperating complementary fixing devices on one of the two surfaces of $m$ printed circuit boards so that the $m$ printed circuit boards are fixed side by side on one surface of said mounting plate, the number $m$ lying between one and four. M connectors for the "high-level" signals are each integral respectively with one of the $m$ printed circuit boards, each connector comprising $p$ male connections which plug into $p$ female connections disposed in $p$ of four holes in said mounting plate, said female connections being crimped on output wires, the number $p$ lying between one and four; and a connector for the "low-level" signals snap fitting into anchor clips forming a part of said mounting plate.

8 Claims, 15 Drawing Figures

MECHANICAL SUPPORT SYSTEM FOR PRINTED CIRCUIT BOARDS

FIELD OF THE INVENTION

The invention relates to a mechanical support system for printed circuit boards forming a part of an electric assembly.

BACKGROUND OF THE INVENTION

It is presently current practice to fit printed circuit boards into horizontal slideways supported by a frame comprising four frame members and two lateral cheeks, the boards entering the slideways vertically. The frames or "baskets" have a standard width of 48.26 cm. The devices also comprise connectors for "low-level" signals fixed on angle members which are themselves fixed on the lateral cheeks and front connectors for the "high-level" signals which can be adapted at the front of the boards. For example, a detailed description of such a device presently used will be found in the article "The INTERMAS mechanical system" by Willy Bohnenberger and Dirk Hesse published by the French Company "Transarck" in 1972.

Preferred embodiments of the present invention provide a mechanical standard or support system for printed circuit boards at a lower cost, comprising fewer parts and hence being very simple to assemble, meeting present standardization requirements but which can be made longer and wider at will by simple assembly and which has a number of other advantages resulting from characteristics which are inherent to the structure of the new system.

SUMMARY OF THE INVENTION

The present invention provides a mechanical support system for printed circuit boards, comprising $n$ identical elementary sub-assemblies assembled together, $n$ being any positive integer, each sub-assembly comprising a moulded plastics mounting plate comprising on one of its surfaces means for fixing by sliding co-operating with complementary fixing means on one of the two surfaces of $m$ printed circuit boards so that the $m$ printed circuit boards be fixed side by side on one surface of said mounting plate, the number $m$ lying between one and four; $m$ connectors for the "high-level" signals each integral respectively with one of the $m$ printed circuit boards, each connector comprising $p$ male contacts which plug into $p$ female contacts disposed in $p$ of four holes in said mounting plate, said female contacts being crimped on output wires, the number $p$ lying between one and four; and a connector for the "low-level" signals snap fitting into anchor clips forming a part of said mounting plate.

According to one embodiment of the invention, the sub-assemblies are assembled parallel in a stack side by side by tie rods passing through said mounting plates.

According to another embodiment of the present invention, the sub-assemblies are assembled vertically one above another by means of two brackets forming a part of the mounting plates and placed at the bottom and top edges on the same side as the "low-level" signal connector, the two brackets being staggered with respect to each other symmetrically in relation to the middle plane in the thickness of said mounting plate.

Said means for fixing said mounting plate are slideways.

Advantageously, the complementary fixing means on the printed circuit boards comprise for each board at least one shank at the back of the printed circuit board on the same side as the soldering, at a short distance from this face of the board and integral by one of its ends with said connector for the "high-level" signals, said shank having a cross-section which is complementary to the cross-section of a slideway of said mounting plate.

According to another embodiment of the present invention, the complementary fixing means on the printed circuit boards comprise for each board two studs fixed perpendicularly on the solder surface of the printed circuit board, the studs having a shape which is complementary to a slideway of the mounting plate in which they are inserted.

According to another characteristic of the invention, the connector for the "high-level" signals comprises a handle enabling the insertion and withdrawal of the printed circuit board connected to its connector in the mounting plate.

According to another characteristic of the invention, said mounting plate comprises on its rear surface, i.e. the opposite surface to that against which the printed circuit boards are installed, a "passage" with an axis perpendicular to said slideways on the other surface, into which open said four holes of the mounting plate and wherein this "passage" leads to an opening at the edges of the mounting plate; this opening forms, when a plurality of elementary sub-assemblies are assembled parallel side by side in a stack, a channel through which pass wires leading to said female connections crimped on one end of the wires and accomodated in said holes.

Other advantages and characteristics of the present invention will become apparent from the description of a non-limiting example of embodiment of the invention given herebelow with reference to the accompanying drawings.

DESCRIPTION OF THE PREFERRED EMBODIMENTS

Figure 1:
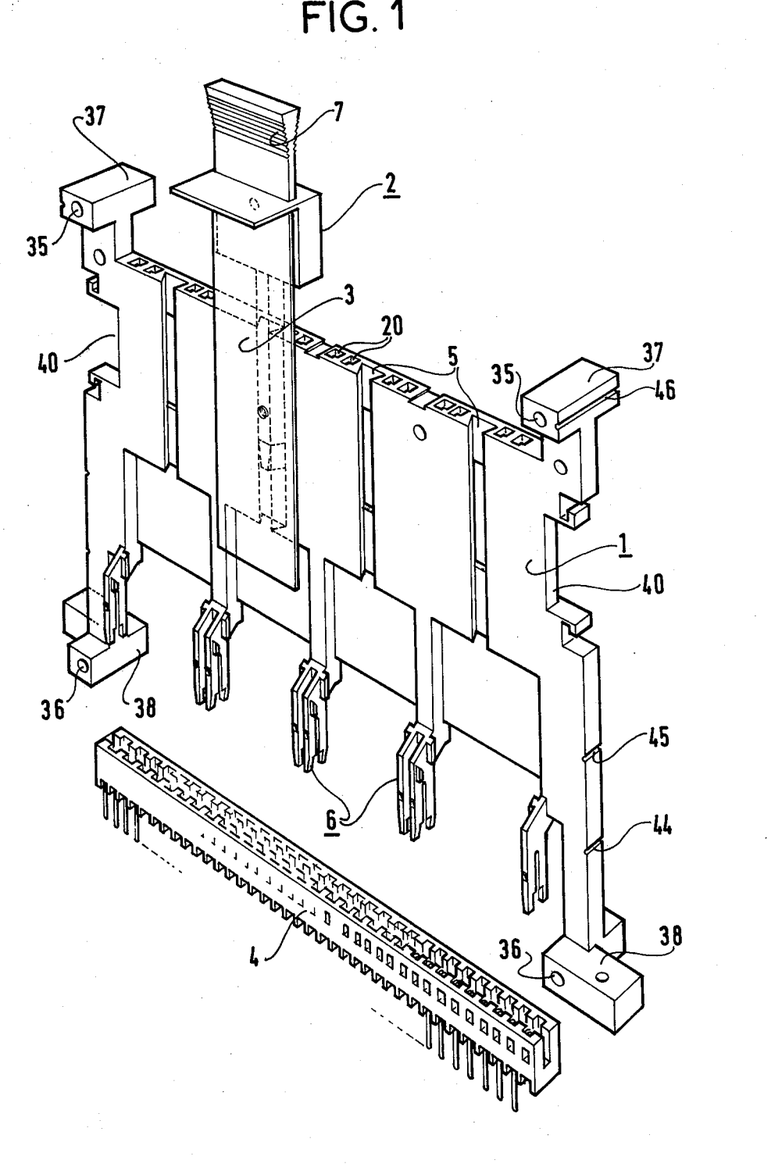
FIG. 1 is a perspective view of a complete sub-assembly embodying the invention.

FIG. 1 shows a sub-assembly comprising a mounting plate 1, a front connector 2, integral with a printed circuit board 3 and a rear connector 4.

The mounting plate 1 includes slideways 5 of dovetail cross-section in which printed circuit boards such as 3 can be fixed and further includes clips 6 for fixing to the rear signal connector 4.

The front connector has a handle 7 for the insertion and withdrawal of the assembly formed by the printed circuit board 3 and the connector 2 into and out the mounting plate 1.

Figure 2:
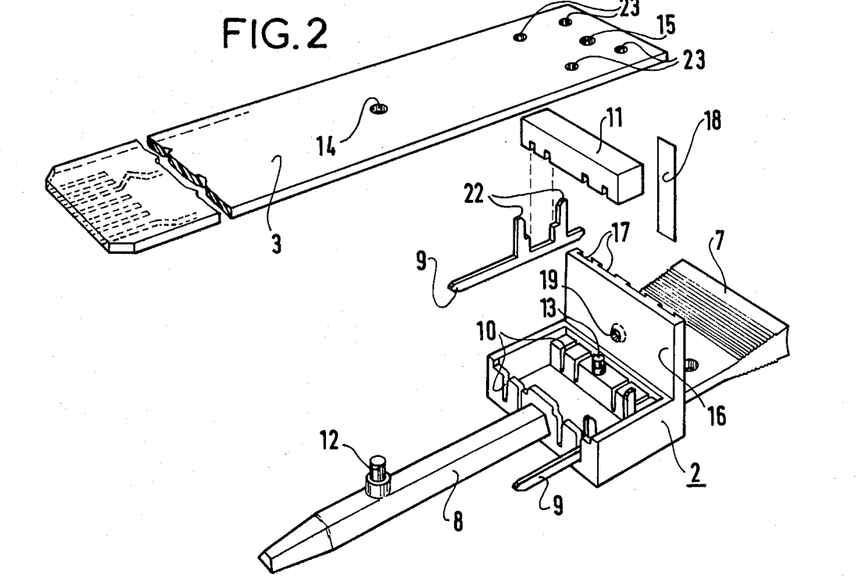
FIG. 2 is an exploded perspective view of a "high-level" signal connector, which will hereinafter be called the front connector, with a printed circuit board.

FIG. 2 is an exploded perspective view of the printed circuit board 3 and the front connector 2 which comprises: the handle 7; a shank 8 with a dovetail cross-section, for sliding into one of the slideways 5 of the mounting plate 1; and two male contacts 9 disposed in slots 10 of the front connector. It will be seen that there are slots to take up to four male contacts if necessary. The contacts are held in place by a key 11. There are two dowels 12 and 13 one of which (the dowel 12) is on the shank 8: the dowels make it possible to fix the printed circuit board 3 to the front connector by their insertion in corresponding holes 14 and 15 of the board 3. The connector 2 includes a plate 16 at the base of the handle 7 which hides the printed circuit board, when everything is assembled; this plate 16 includes four small slideways 17 with dovetail cross-section in which labels such as 18 can be inserted. The front plate 16 is pierced with a hole 19 enabling a user to observe whether the board is functioning properly by means of an indicator system on the printed circuit board 3 and disposed behind the hole 19.

Figure 8:
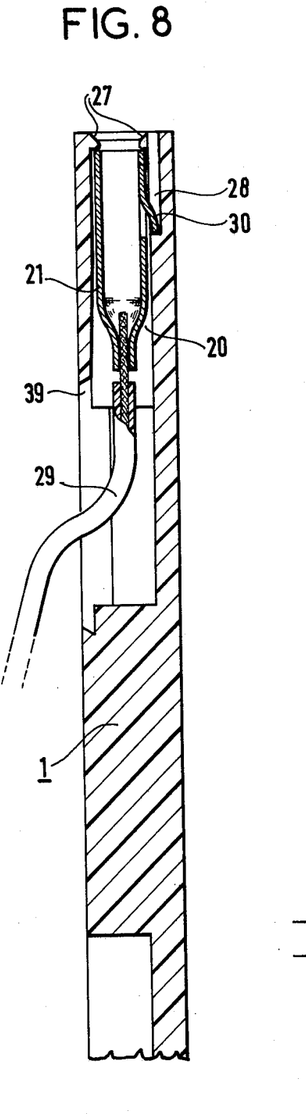
FIG. 8 is a cross-section along VIII—VIII in FIG. 5.

When the connector 2 is inserted in the mounting plate 1, the male contacts enter holes 20 in the mounting plate 1 in which there are female contacts 21 (FIG. 8).

Figure 3:
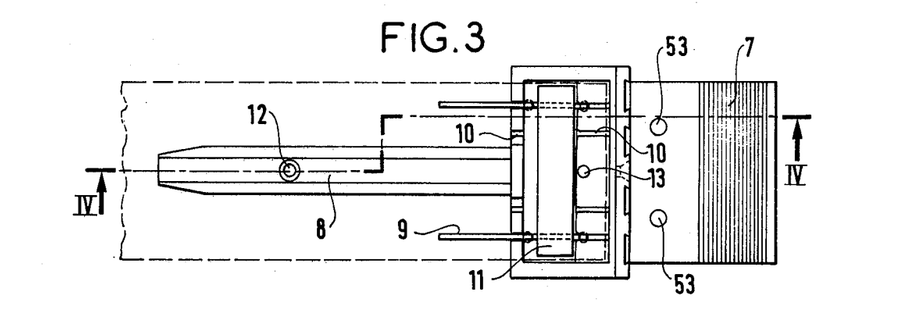
FIG. 3 is a plan view of the connector with the board shown in thin discontinuous lines.
Figure 4:
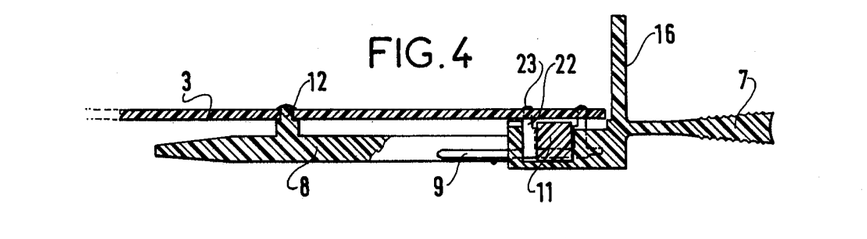
FIG. 4 is a cross-section along IV—IV in FIG. 3.

FIG. 4 which is a cross-section along IV—IV in FIG. 3 shows the position of all the parts of the connector and the printed circuit board, once assembled. This figure shows that each contact 9 has two anchor clips 22 that enter two corresponding holes 23 in the board 3.

Figure 5:
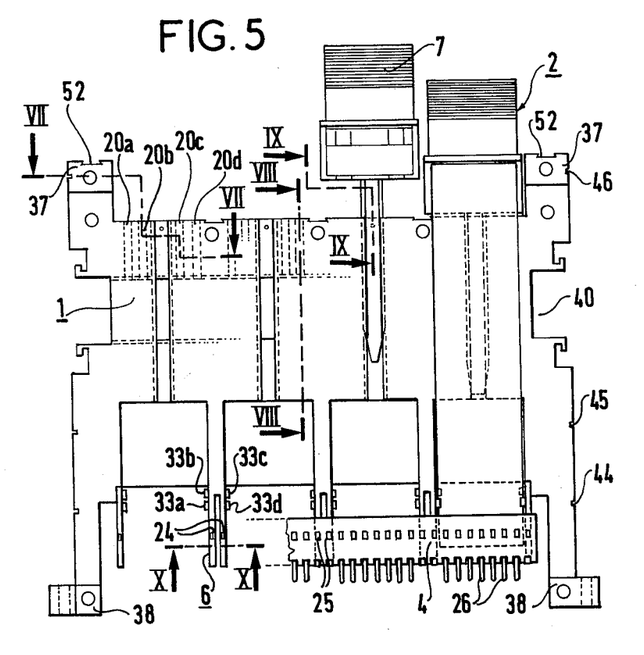
FIG. 5 is a vertical elevation which shows a mounting plate embodying the invention seen from the side nearest the slide grooves for fixing the printed circuit boards and on this mounting plate; a printed circuit board with its front connector, a front connector without its printed circuit board and a connector for the "low-level" signals which will hereinafter be called the rear connector.
Figure 6:
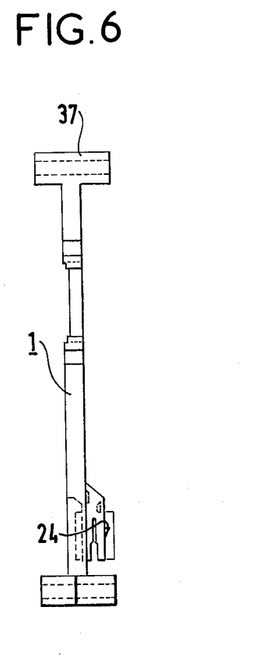
FIG. 6 is a left-side view of the device of FIG. 5.

FIG. 5 is a side view of the mounting plate 1 showing a front connector without its printed circuit board, a front connector with its board and rear connector, while FIG. 6 shows the mounting plate alone, seen from the left-hand edge, showing the rear connector in faint lines. In these figures, it is seen that the anchor clips 6 of the rear connector 4 comprise small lugs 24 for snap fitting of the rear connector 4 with the anchor clips 6, the lugs 24 entering holes 25 in the rear connector 4 which are not used for fixing male contacts 26. The lugs 24 are clearly shown in FIG. 10 which is an enlarged cross-section along X—X in FIG. 5.

Figure 7:
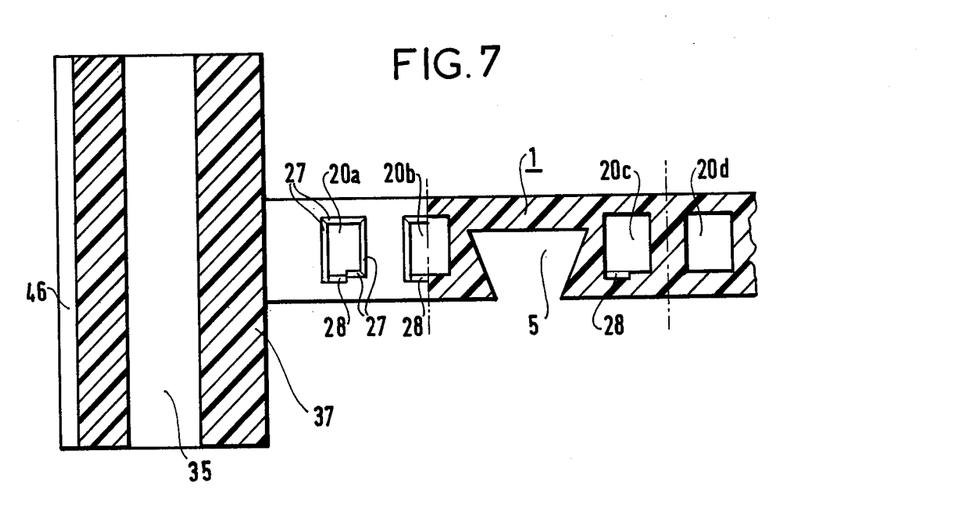
FIG. 7 is a cross-section along VII—VII in FIG. 5.

FIG. 7 is a greatly enlarged cross-section along VII—VII of FIG. 5 showing in detail the holes 20 intended to accomodate the female contacts 21 shown in FIG. 8 which is described simultaneously with FIG. 7.

FIG. 7 shows four of these holes which have been referenced 20a, 20b, 20c and 20d.

The hole 20a is seen from above and it has a rim 27 disposed around three and a half of its sides, the rim 27 being clearly shown at the top part of the hole 20 (FIG. 8) and serving as a stop for the female contact 21. The hole 20b is shown in a half cross-section, the hole 20c being shown in cross-section, this making it possible to see a notch 28 which is shown even more clearly in FIG. 8, for snap fitting of the female contact 21. Lastly, the hole 20d is shown sectioned below the notch 28. The female contact 21 is crimped on a wire 29 and is inserted into its hole 20 from below until its tongue 30 snap fits into the notch 28. As the front connectors are inserted, the male contacts 9 are received in the female contacts 21.

Figure 9:
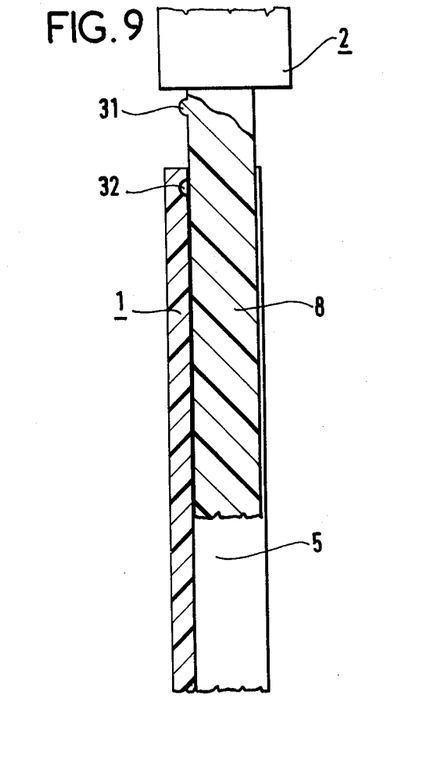
FIG. 9 is a cross-section along IX—IX in FIG. 5.

FIG. 9 is a cross-section along IX—IX in FIG. 5 and shows in detail the snap fitting of the shank 8 for fixing a connector 2 in a slideway 5 of the mounting plate 1. The shank has a small spherical boss 31 and the plate 1 has a complementary cavity 32.

Figure 10:
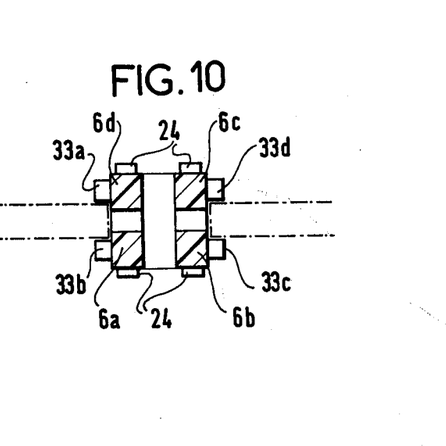
FIG. 10 is a cross-section along X—X in FIG. 5.

FIG. 10 is a cross-section along X—X in FIG. 5 and shows, in detail and on an enlarged scale, an anchor clip 6 which is constituted by four parts: 6a, 6b, 6c and 6d. It includes four lugs 24 for snap fitting the connector 4 and four guide studs 33a, 33b, 33c and 33d for guiding the printed circuit boards, these studs are also shown in FIG. 5.

Figure 11:
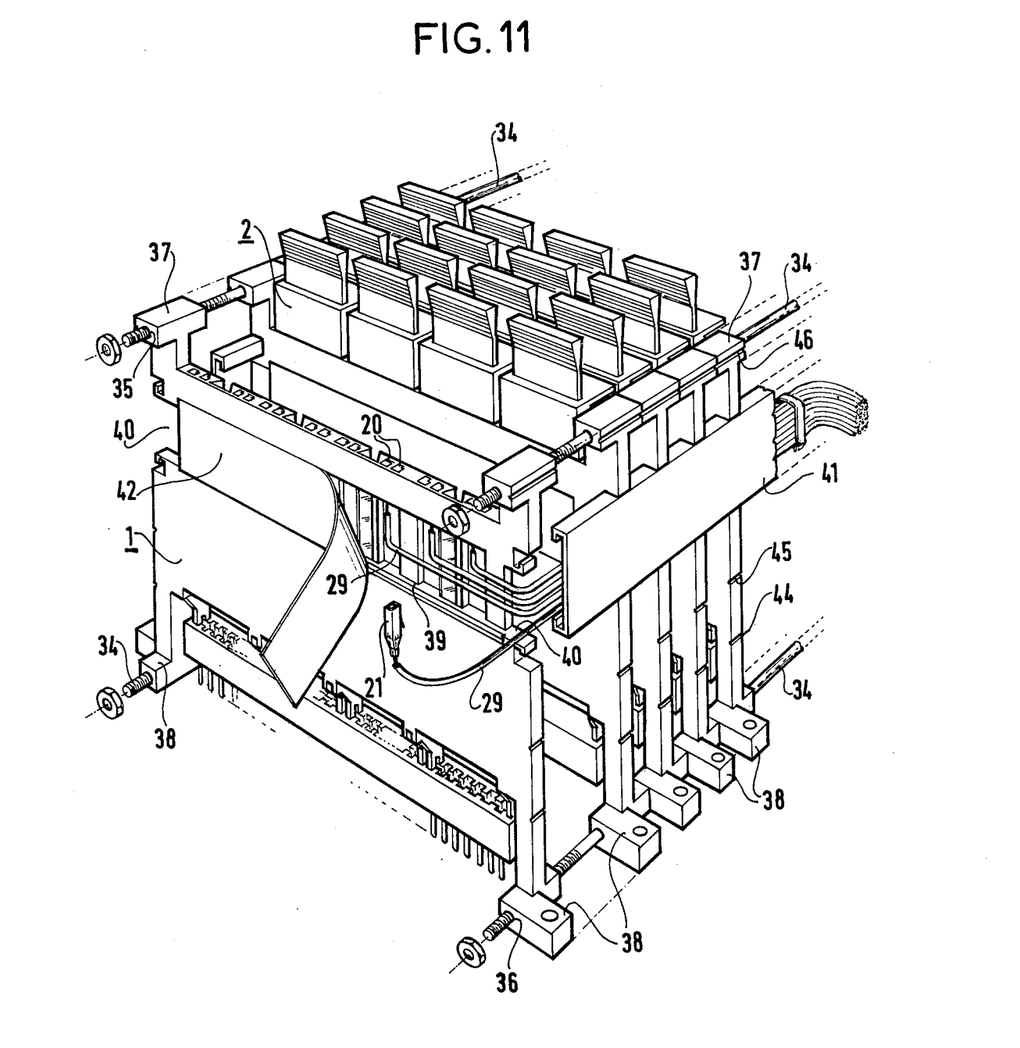
FIG. 11 is a perspective view of an assembly of five mounting plates.

FIG. 11 shows a number of sub-assemblies assembled in parallel in a stack by tie rods 34 passing through holes 35 and 36 (FIG. 1) in respective brackets 37 and 38 provided at the four corners of the mounting plate for the assembling and fixing of the assembly. This figure shows a "passage" 39 (also shown in FIG. 8) into which the holes 20 lead and through which the wires 29 are passed. The passage 39 is at the side of the mounting plates, i.e. on the opposite surface to that shown in FIGS. 1 and 5, and on the same side as the surface through which the female contacts 21 are inserted into the holes 20 (see FIG. 8). The passage 39 leads on each edge of the mounting plates to an opening 40 provided in the edge surface, providing a channel for the stack formed by assembly of a plurality of sub-assemblies for collecting the wires 29 coming from the "passages" 39 of all the mounting plates 1. The channel is closed by a cover 41. Likewise, the "passages" 39 are closed by a closure strip 42 e.g. made of a plastics material.

Figure 12:
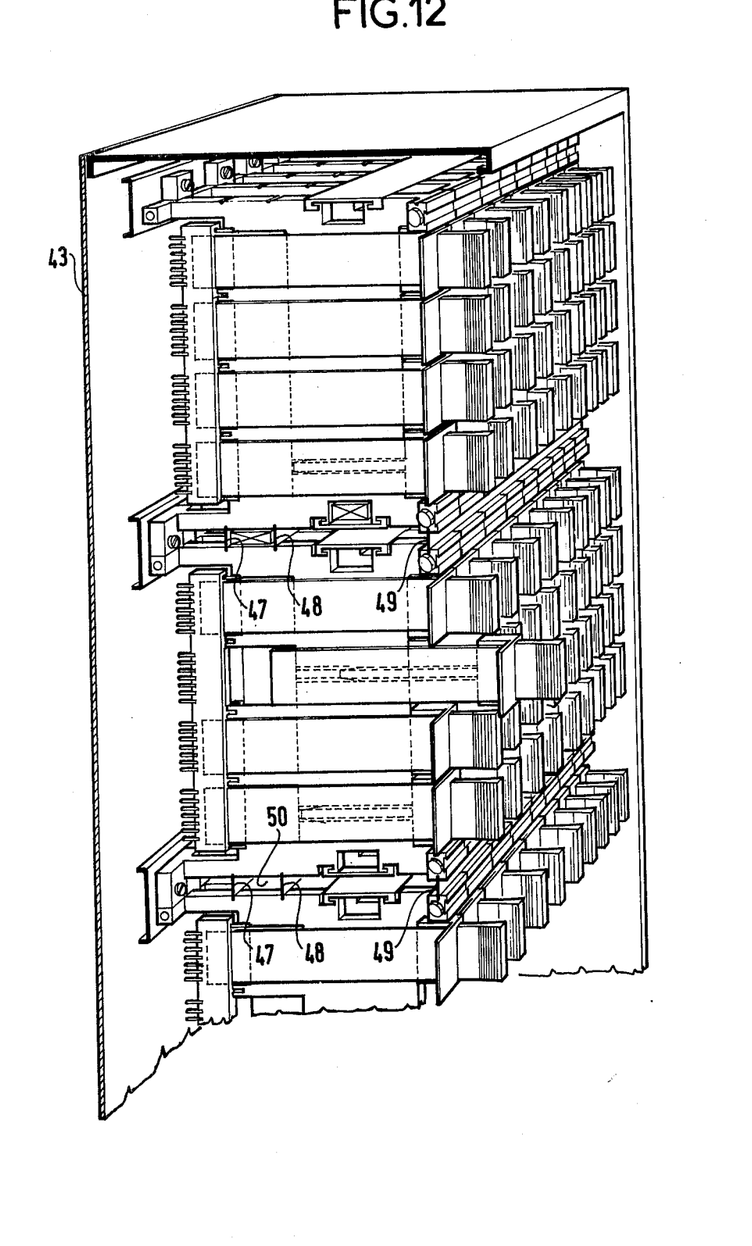
FIG. 12 is a perspective view of a superposed assembly in a cabinet.

FIG. 12 shows an assembly of a plurality of stacks superposed and placed in a cabinet 43 in a normal operating position. To be able to superpose a plurality of stacks, the two L-shaped rear brackets 38 are inverted symmetrically with respect to each other in relation to the middle plane of the mounting plate (FIG. 1). The assembly of these brackets is clearly seen in FIG. 13 which shows an embodiment in which the various stacks have been placed horizontally next to each other, only the first mounting plate of each stack being shown. The mounting plates further comprise on each of their edge surfaces three grooves 44, 45 and 46, the grooves 46 being provided in the front brackets 37; these grooves which are clearly visible in FIGS. 1, 5 and 11 make it possible to slide rigid strips 47, 48 and 49 made of a plastics material between two superposed stacks (FIG. 12).

The strips 47 and 48 make it possible to delimit e.g. a possible cable run 50 and the strip 49 makes it possible to hide the back and to install a label.

Figures 13, 14, 15:
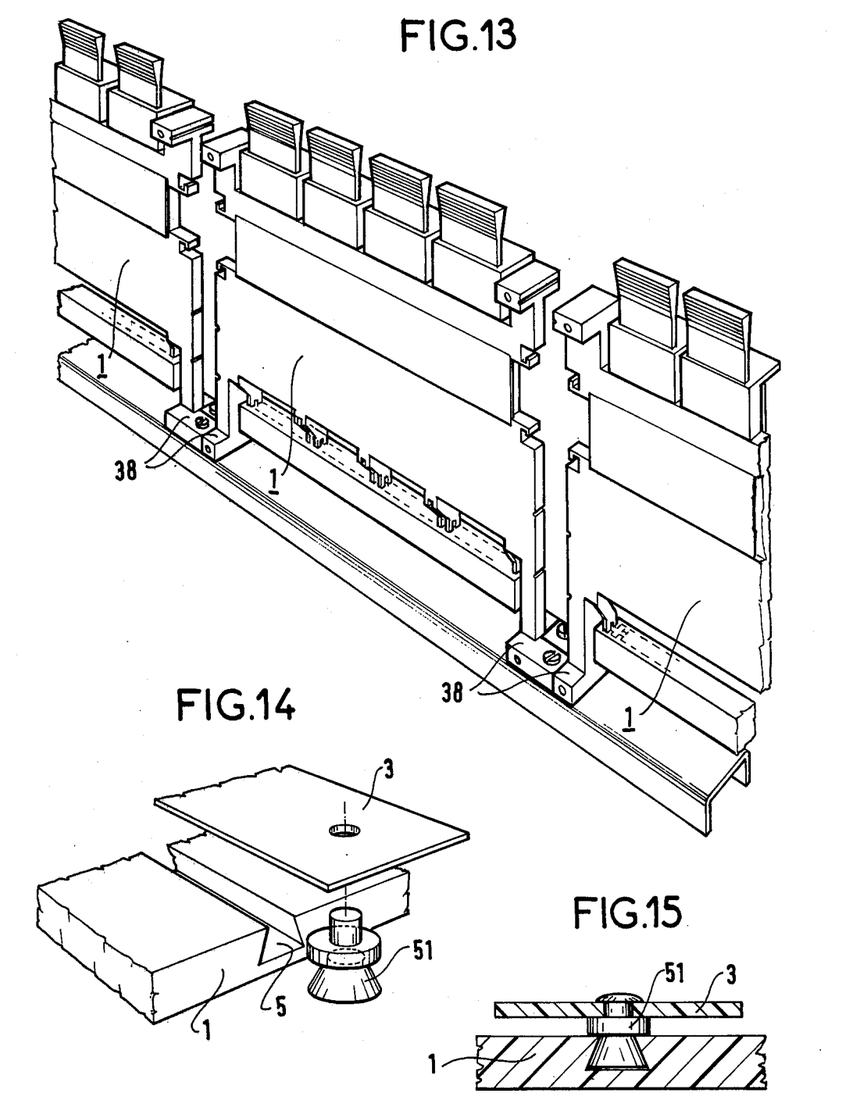
FIG. 13 is a perspective view of a variant of assembly of the mounting plates.
FIGS. 14 and 15 are an exploded, perspective view and a sectional view, respectively of one embodiment of the system for fixing a printed circuit board on a mounting plate.

FIGS. 14 and 15 show a variant of the device for fixing the printed circuit boards on the mounting plate: the shank 8 integral with the front connector 2 is replaced by two studs 51 fixed on the printed circuit board and which can be slid in the slideway 5 of the mounting plate 1.

FIG. 5 shows that the brackets 37 each comprises a slideway 52 with a dovetail cross-section allowing a reference label to be placed therein.

FIGS. 2 and 3 also show that the handle 7 of the front connector 2 includes two holes 53 enabling several handles to be interconnected in order to make them integral to insert them and withdraw them together for cutting out electrical functions and for operational security.

Of course, this system shows mounting plates accomodating four printed circuit boards each, but a single large printed circuit board having one or several manipulation handles such as 7 can also be inserted in a mounting plate and this printed circuit board can comprise one or several shanks or several studs such as 51 for fixing it on the mounting plate. Further, two printed circuit boards can be inserted one of which is three times wider than the other or even two printed circuit boards of equal width, each equal to half the width allowed for printed circuit boards on the mounting plate.

It will easily be understood that the advantage of this system resides in the separation of the low-level electric circuits, i.e. service signals, internal processing signals and control signals from high-level electric or electromechanical circuits corresponding to the operational electric and electromechanical circuits (exterior inputs and outputs).

Numerous details can be replaced by equivalent means fulfilling the same function without going beyond the scope of the invention thereby.

What we claim is:

1. A mechanical support system for printed circuit boards, said support system comprising $n$ identical elementary sub-assemblies assembled together, $n$ being any positive integer, each sub-assembly comprising: $m$ printed circuit boards, $m$ connectors for the "high-level" signals, a molded plastics mounting plate, interlocking, sliding, cooperating complementary fixing means carried respectively on one of the two surfaces of $m$ printed circuit board and on one surface of said mounting plate for fixing said $m$ printed circuit boards side by side, on said one surface of said mounting plate, the number $m$ lying between one and four; each of said $m$ connectors for the "high-level" signals being integral respectively with one of the $m$ printed circuit boards, being mounted on said one surface of said $m$ printed circuit board and projecting outwardly therefrom, said plastics mounting plate including an edge facing and aligned with an edge of said $m$ connectors for the high level signals and having holes therein receiving female contacts, and wherein each of said $m$ connectors for the "high-level" signals includes $p$ male contacts which plug into $p$ female contacts disposed in $p$ holes in said mounting plate, output wires crimped to said female contacts carried by said plastics mounting plate, the number $p$ lying between one and four; at least one connector for the "low-level" signals, anchor clips formed integrally with said mounting plate along an edge opposite to that carrying said female contact and snap fitted to said connector for the "low-level" signals and said connector for the "low-level" signals being slotted to receive the projecting end of said $m$ printed circuit board and carrying connectors for contact with circuit means carried by said $m$ printed circuit board laterally offset from the plane of contact between the female contacts of said mounting plate and the male contacts of said $m$ connectors for the "high-level" signals.

2. A mechanical support system according to claim 1, wherein tie rods passing through said mounting plates assemble the sub-assemblies parallel in a stack side by side.

3. A mechanical support system according to claim 1, wherein two brackets forming a part of the mounting plates and placed respectively at the bottom and top edges on the same side as the "low-level" signal connector to assemble the sub-assemblies vertically, one above the other, the two brackets being staggered with respect to each other symmetrically in relation to the middle plane in the thickness of said mounting plate.

4. A mechanical support system according to claim 1, wherein said fixing means comprises slideways carried by said mounting plate and receiving complementary means carried by said $m$ printed circuit boards.

5. A mechanical support system according to claim 4, wherein the complementary fixing means on the printed circuit boards comprise for each board at least one shank at the back of the printed circuit board on the same side as the soldering, at a short distance from this face of the board and integral by one of its ends with said connector for the "high-level" signals, said shank having a cross-section which is complementary to the cross-section of a slideway of said mounting plate.

6. A mechanical support system according to claim 4, wherein the complementary fixing means on the printed circuit boards comprise for each board two studs fixed perpendicularly on the solder surface of the printed circuit board, said studs having a shape which is complementary to a slideway of the mounting plate in which they are inserted.

7. A mechanical support system according to claim 1, wherein the connector for the "high-level" signals comprises a handle for effecting the insertion and withdrawal of the printed circuit board connected to its connector in the mounting plate.

8. A mechanical support system according to claim 1, wherein said mounting plate comprises on the surface opposite to that against which the printed circuit boards are installed, a means defining passage with an axis perpendicular to said slideways on the other surface, into which open said four holes of the mounting plate and wherein said passage defining means leads to an opening at the edges of the mounting plate; said opening forming, when a plurality of elementary sub-assemblies are assembled parallel side by side in a stack, a channel through which may pass wires leading to said female connections crimped on one end of the wires and accommodated in said holes.

* * * * *